United States Patent [19]

Doten et al.

[11] 4,295,596
[45] Oct. 20, 1981

[54] METHODS AND APPARATUS FOR BONDING AN ARTICLE TO A METALLIZED SUBSTRATE

[75] Inventors: Bradford O. Doten, Hopewell Township, Mercer County, N.J.; John J. Svitak, Lower Makefield Township, Bucks County, Pa.

[73] Assignee: Western Electric Company, Inc., New York, N.Y.

[21] Appl. No.: 105,463

[22] Filed: Dec. 19, 1979

[51] Int. Cl.³ .......................... B23K 1/12; H01S 21/60
[52] U.S. Cl. ............................... 228/180 A; 228/6 A; 228/242; 228/264
[58] Field of Search .................. 228/180 A, 242, 264, 228/6 A, 20; 219/85 F, 373

[56] References Cited

U.S. PATENT DOCUMENTS

| | | | |
|---|---|---|---|
| 3,534,462 | 8/1967 | Cruickshank et al. | 228/242 X |
| 3,696,229 | 10/1972 | Angelucci et al. | 219/85 F |
| 3,776,394 | 12/1973 | Miller | 214/1 R |
| 3,793,710 | 2/1974 | Monahan et al. | 228/6 A X |
| 3,920,949 | 11/1975 | Clawson et al. | 219/85 F |

OTHER PUBLICATIONS

Trollman, "Solder Reflow Tool", IBM Tech. Disclosure Bulletin, vol. II, No. 10, Mar. 1969, p. 1298.
Greer, "Low Expansivity Organic Substrate", 11 (p. 170), *Proceedings of the 28th Electronics Components Conference*, Anaheim, Calif., Apr. 1978.
Markstein, *Electronic Packaging and Production*, Apr. 1979, pp. 79-84.
Settle, Capt. R. E., *Solid State Technology*, Jun. 1978, pp. 54-58.
Balde, *Computer Magazine*, Dec. 1977, pp. 58-68.
Prokop et al., Third Quarterly Report, Contract No. F33615-78-C-5147, Patterson AFB, Oh., Jul. 15, 1979.
"PAK-X-TRAC", Brochure, New Concepts Systems, Colmar, Pa., 1975.

*Primary Examiner*—Gil Weidenfeld
*Assistant Examiner*—K. J. Ramsey
*Attorney, Agent, or Firm*—D. J. Kirk

[57] ABSTRACT

A chip carrier (5) having a plurality of first ends (21—21) is aligned with and bonded to mating lands (34—34) on a PCB substrate (31) by positioning the carrier in a recess of a nozzle (66) on the tool and directing individual streams of hot gas horizontally onto the terminals and lands to cause previously deposited solder thereon to reflow to bond the articles together. Alternatively, articles bonded with reflowable material may be de-bonded in a like manner.

9 Claims, 16 Drawing Figures

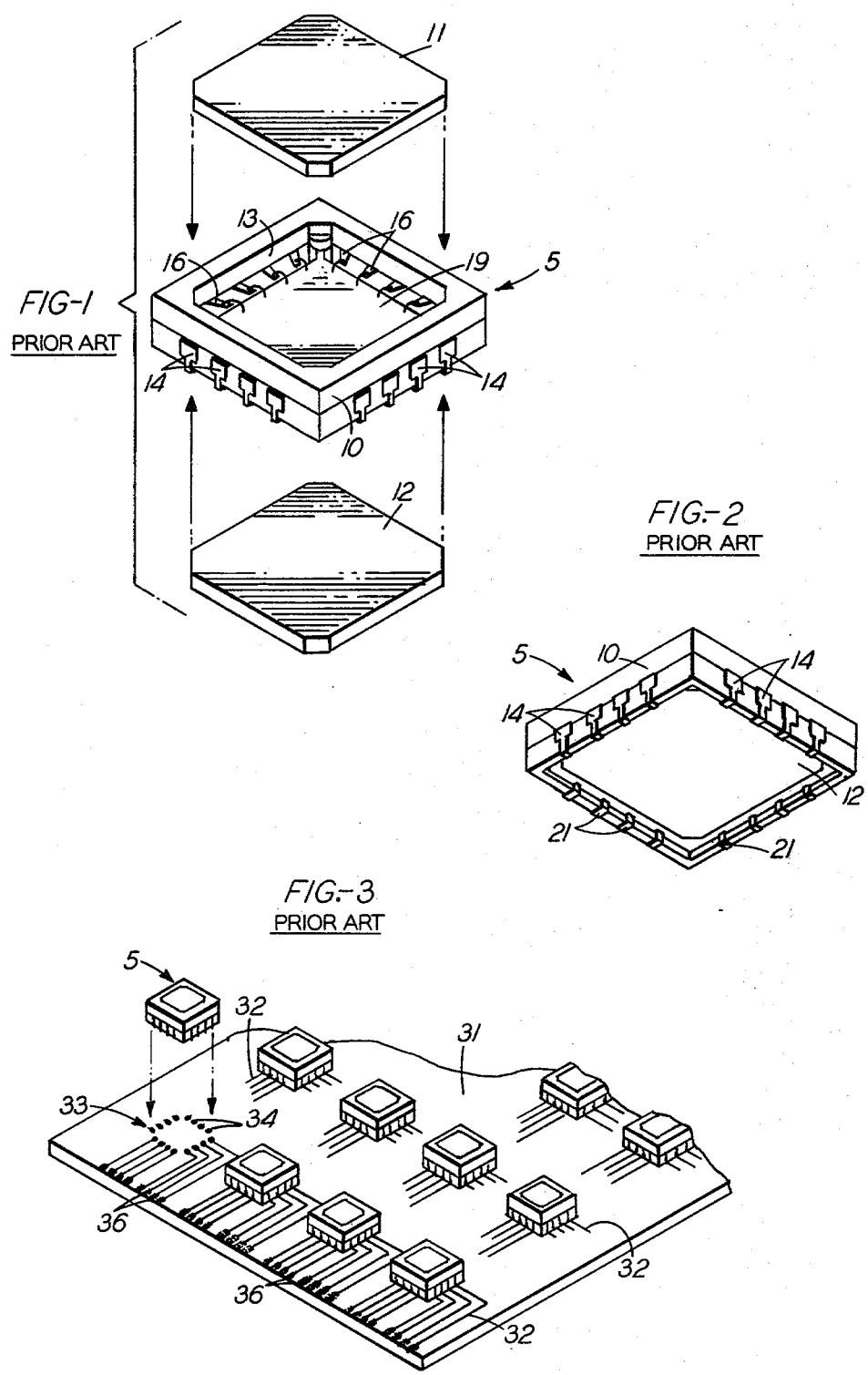

METHODS AND APPARATUS FOR BONDING AN ARTICLE TO A METALLIZED SUBSTRATE

TECHNICAL FIELD

The instant invention is related to bonding articles. In particular, the invention is directed to bonding objects to the surface of metallized substrates.

BACKGROUND OF THE INVENTION

In recent years "chip carriers" have emerged as a promising high-volume device packaging technique. In its simplest form a chip carrier is a substantially square, relatively thin, article having a cavity with bonding pads therein which are connected by a plurality of electrically conductive leads that extend through walls of the carrier, along the side walls, and terminate on the underside of the carrier. A semiconductor circuit chip is placed in the cavity, connected to the bonding pads and a cover is placed over the cavity which may be used to hermetically seal the chip therein.

A multitude of such chip carriers may be soldered to conductive lands on the surface of a Printed Circuit Board (PCB). The conductive lands are aligned with the leads on the underside of the chip carrier, at least one of which will have predeposited amounts of solder thereon, the leads and lands are then placed in contact and the solder reflowed to effect a bond.

Various techniques have been used to reflow the solder. Condensation soldering and various types of belt furnaces have proven effective for soldering the leads of chip carriers to the lands on a PCB or other metallized conductor patterns on a substrate. However, when one or more of the chip carriers has to be soldered in a densely packed array or has to be removed for replacement or repair, the condensation and belt furnace techniques melt solder connections of neighboring chip carriers. This can also cause alloying and possible embrittlement of those solder connections. Additionally, other chip carriers or components on the PCB may undesirably move or be exposed to damage due to excessive heat.

Heating tools have been devised to clamp all four sides of a chip carrier to reflow the solder and remove the carrier from the PCB. However, such direct contact with a heating tool can damage the carrier and/or PCB. Direct contact also results in some flux adhering to the tool, making controlled release of the chip carrier difficult. All soldering connections must be molten at the time of chip carrier removal or during replacement reflow, a condition difficult to achieve with contact tools.

One solution to the problem is described in copending patent application Ser. No. 80,816, filed on Oct. 1, 1979. This application describes an apparatus for simultaneously soldering terminals on a multi-sided article having at least one terminal on each side, to mating land areas on the surface of a metallized substrate. Hot gas is directed through a plurality of angled slots in a housing onto the terminals and land areas to form a bond therebetween. Although such a technique is most effective in forming a bond, it has been found that a substantial amount of heat is imparted to the PCB due to direct and/or deflected impingement of the hot gas thereon. Such heat can cause undesirable cracking, degradation and/or deformation of the PCB in the vicinity of the chip carrier.

Accordingly, there is a need for a universal soldering tool that is capable of soldering or desoldering chip carriers or the like to the surface of metallized substrates without significant heat being applied to the substrate or other components thereon.

SUMMARY OF THE INVENTION

The instant invention overcomes the foregoing and other problems with a method for bonding an article to a metallized substrate, at least one of which has a predeposited reflowable bonding material thereon. The method comprises the steps of: positioning the article on the substrate; directing at least one stream of hot gas towards the substrate; redirecting the gas stream laterally, towards the article, to reflow the material; and resolidifying the material to form a bond between the article and the substrate.

BRIEF DESCRIPTION OF THE DRAWING

FIG. 1 is an exploded view of a chip carrier;

FIG. 2 is an isometric bottom view of a chip carrier;

FIG. 3 is an isometric view of a printed circuit board having a plurality of chip carriers soldered thereto;

DETAILED DESCRIPTION

Figure 4:
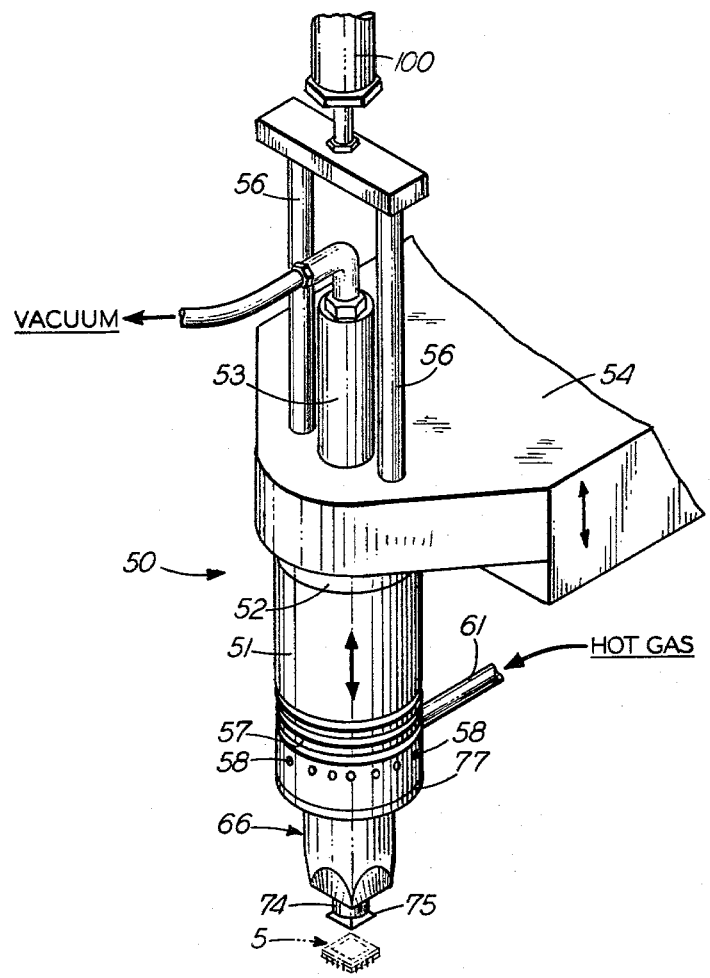
FIG. 4 depicts a bonding apparatus embodying the instant inventive concepts.

The instant invention is directed to bonding a chip carrier to a Printed Circuit Board (PCB). However, such description is for the purposes of exposition and not for limitation. The bonding technique can be implemented whenever an article is to be bonded to the surface of a metallized substrate.

FIG. 1 is an exploded view of a typical chip carrier device, generally designated by the numeral 5, which is well known in the art. The chip carrier 5 is comprised of a body portion 10 having top and bottom caps 11 and 12, respectively, which enclose a cavity 13.

A plurality of conductive leads 14—14 extend through the body portion 10 and have first ends 16—16 located within the cavity 13 which are bonded to a semiconductor chip 19 mounted therein. Second ends 21—21 (see FIG. 2) of the leads 14—14 project through the outside of the body portion 10 and are bent thereunder and in contact therewith.

In a particular application, shown in FIG. 3, a plurality of such chip carriers 5—5 are bonded to PCB substrate 31 having metallized circuit paths 32 thereon. The substrate 31 has a multitude of bonding pad arrays, generally indicated by the numeral 33, the array comprising a plurality of presoldered land areas 34—34 geometrically arranged in a pattern that can mate with second ends 21—21 of leads 14—14 on the chip carrier 5. Circuit paths 32—32 form electrical connections between land areas 34—34 between other lands and/or metallized contact fingers 36—36 located proximate the edge of the PCB substrate 31.

Problems arise when it becomes necessary to solder a device such as a chip carrier 5 to the surface of a PCB substrate 31. The clearance between the bottom of a carrier 5 and the surface of the PCB 31 is too small to permit access to a contact soldering tool without the potential of damaging the board and/or the carrier. Techniques such as condensation soldering and infrared heating have been used to solder the carriers 5—5 to the land areas 34—34 on the PCB substrate 31. However, it is difficult to maintain the chip carriers 5—5 in proper orientation with the land areas 34—34 during reflow and it is most difficult to remove a single bonded carrier from a dense array of carriers for replacement or repair. Other techniques such as directing hot gases on the top surface of a semiconductor chip carrier 5 to transfer heat therethrough to the solder preforms on the PCB substrate 31 have been used to bond chips to substrates. However, chip carriers 5—5 are fragile and can be damaged by transferring sufficient heat therethrough to cause the solder to reflow on the underside of the carriers.

Additionally, hot gas directed towards the bond site through angled slots, as described in the above-referred to patent application, can, at times, impart sufficient heat to the substrate to cause cracking or deformation thereof.

Figure 5:
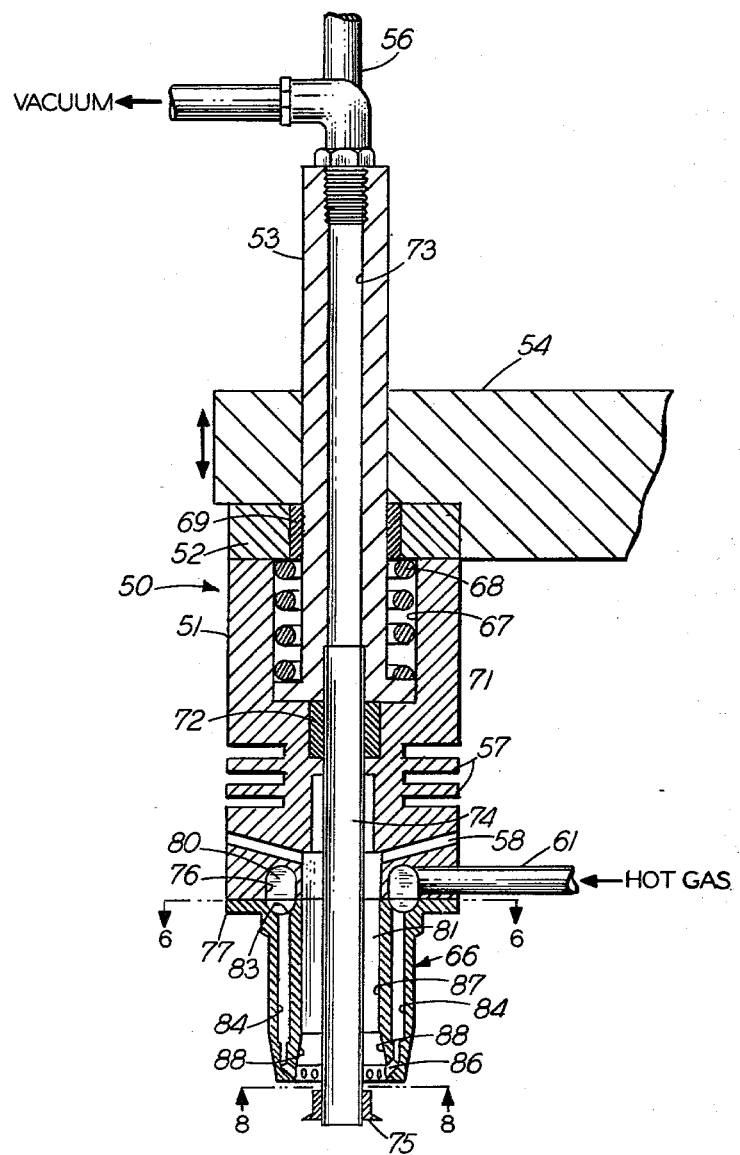
FIG. 5 is a cross-sectional view of the exemplary bonding tool.

The instant bonding tool, generally indicated by the numeral 50, in FIGS. 4 and 5, overcomes the foregoing problems with an apparatus for bonding the second lead ends 21—21 of a chip carrier 5 in contact with the land areas 34—34 in an array 33 (see FIG. 3). The tool 50 is capable of laterally directing (i.e., substantially parallel to the plane of the PCB substrate 31) hot gas at the lead ends 21—21 and the lands 34—34 to cause the solder thereon to reflow and form a bond therebetween. Such lateral impingement of the hot gas has been found to provide an acceptable bond while decreasing the amount of heat imparted to the substrate 31 without disturbing other components thereon.

The bonding tool 50 is comprised of a cylindrical body portion 51 with an end cap 52 having a tube 53 extending therethrough. The tube 53 is fixedly mounted to a support member 54 which is mounted for vertical movement. A pair of movable push rods 56—56 also pass through the support member 54 and terminate at the end cap 52.

The body portion 51 has a plurality of cooling fins 57—57 and gas exit ports 58—58 and a hot gas line 61 is connected thereto. A nozzle 66 is mounted at the lower end of the body portion 51. The body portion 51 has a cavity 67 (see FIG. 5) with a spring member 68 mounted thereon, about the tube 53. The spring member 68 extends between a first sleeve bearing 69 and a flange 71 radially extending from the tube 53. A second sleeve bearing 72 is centrally located just below the flange 71.

The tube 53 has a longitudinal channel 73 therethrough which axially communicates with a vacuum source at one end and tubular extension member 74 having a flared end fitting 75 at the other end, tube end 74a protruding slightly below the fitting. The hot gas line 61 communicates with a first groove 76, in the lower end of the body portion 51, having a substantially inverted "U"-shaped cross section.

Figure 6:
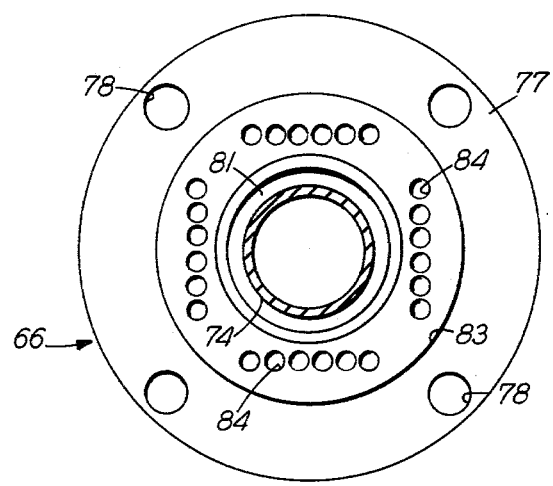
FIG. 6 is a top view of a hot gas nozzle used in a first embodiment of the instant invention.

A top view of one embodiment of the nozzle 66 (see FIG. 6), taken in plane 6—6 as shown in FIG. 5, has a flange 77 with a plurality of openings 78—78 therein. The nozzle 66 is held in place on the bottom of the body portion 51 with a plurality of bolts (not shown) which pass through the openings 78—78 and are threadably connected to the body portion. The nozzle 66 has a central cavity 81 into which the extension member 74 axially projects. The upper portion of the nozzle 66 has second groove 83 of substantially semicircular cross section which mates with the first groove 76 in the body portion 51 to form an annular channel 80. A plurality of parallel channels 84 extend, within the wall, in a rectangular array, from the groove 83 to an angled deflector 86 at the lower end of the nozzle 66. The wall 87 defining the central cavity 81 has an outwardly flared lower end 88.

Figure 7:
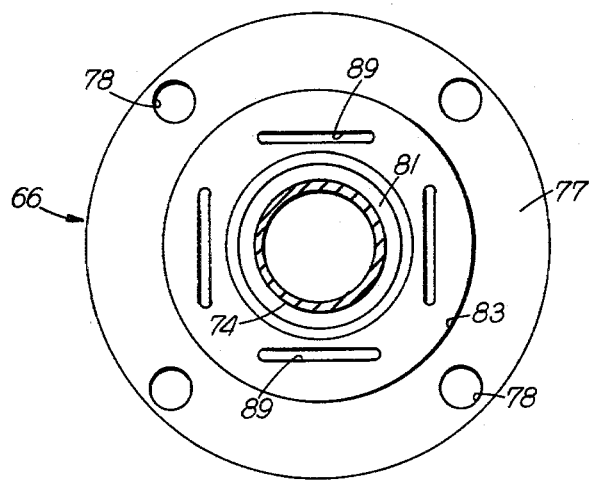
FIG. 7 is a top view of a hot gas nozzle used in a second embodiment of the instant invention.
Figure 8:
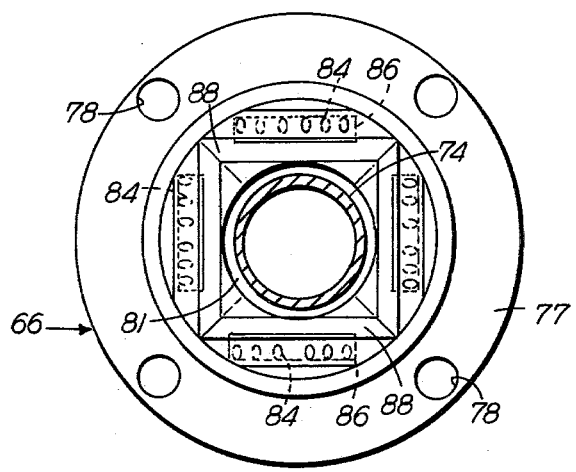
FIG. 8 is a bottom view of a hot gas nozzle used to implement the instant invention.

FIG. 7 is also a view taken through plane 6—6 wherein a second embodiment of the nozzle 66 has elongated slots 89—89 formed in the wall 87. FIG. 8 is a bottom view of the nozzle 66 taken through plane 8—8 in FIG. 6.

Figure 9:
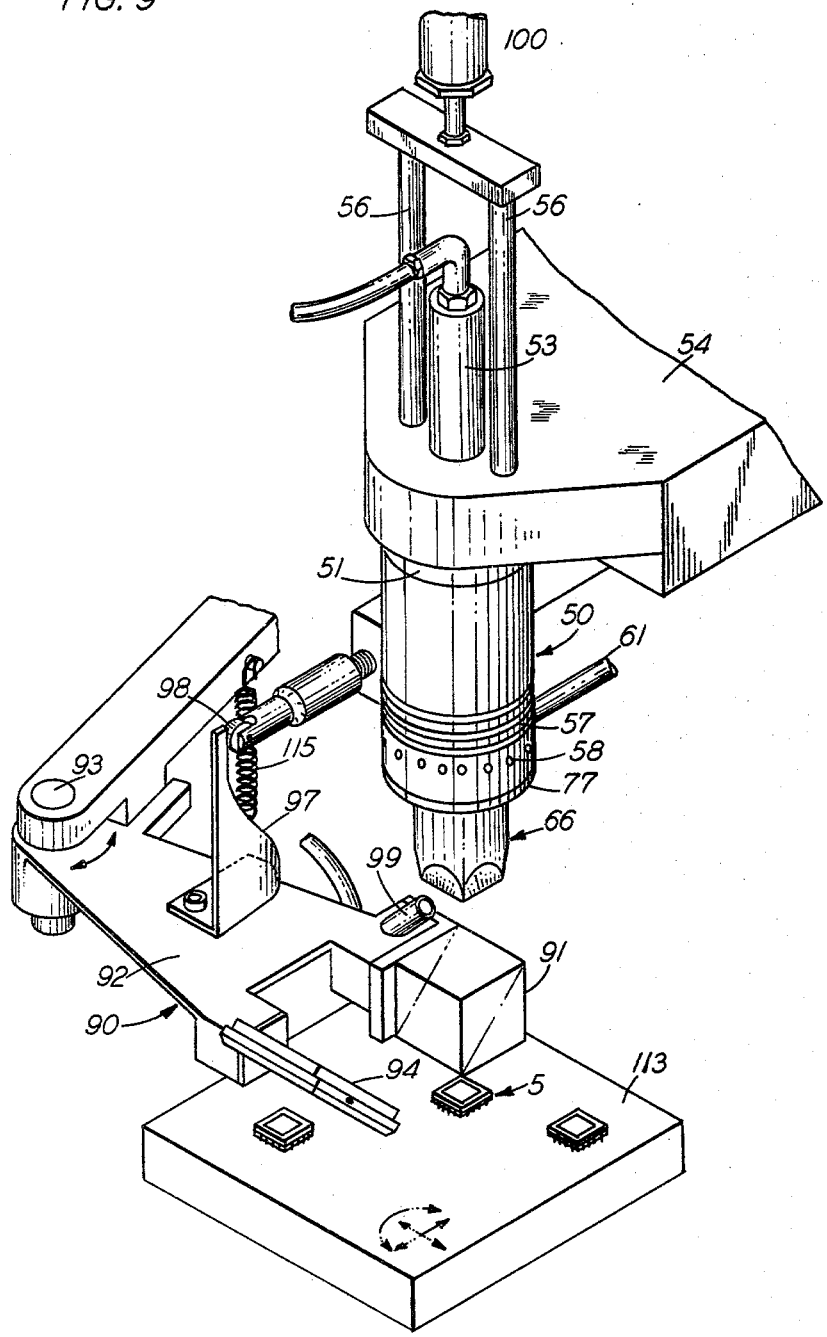
FIGS. 9 and 10 depict alignment apparatus used in conjunction with the instant bonding apparatus.
Figure 10:
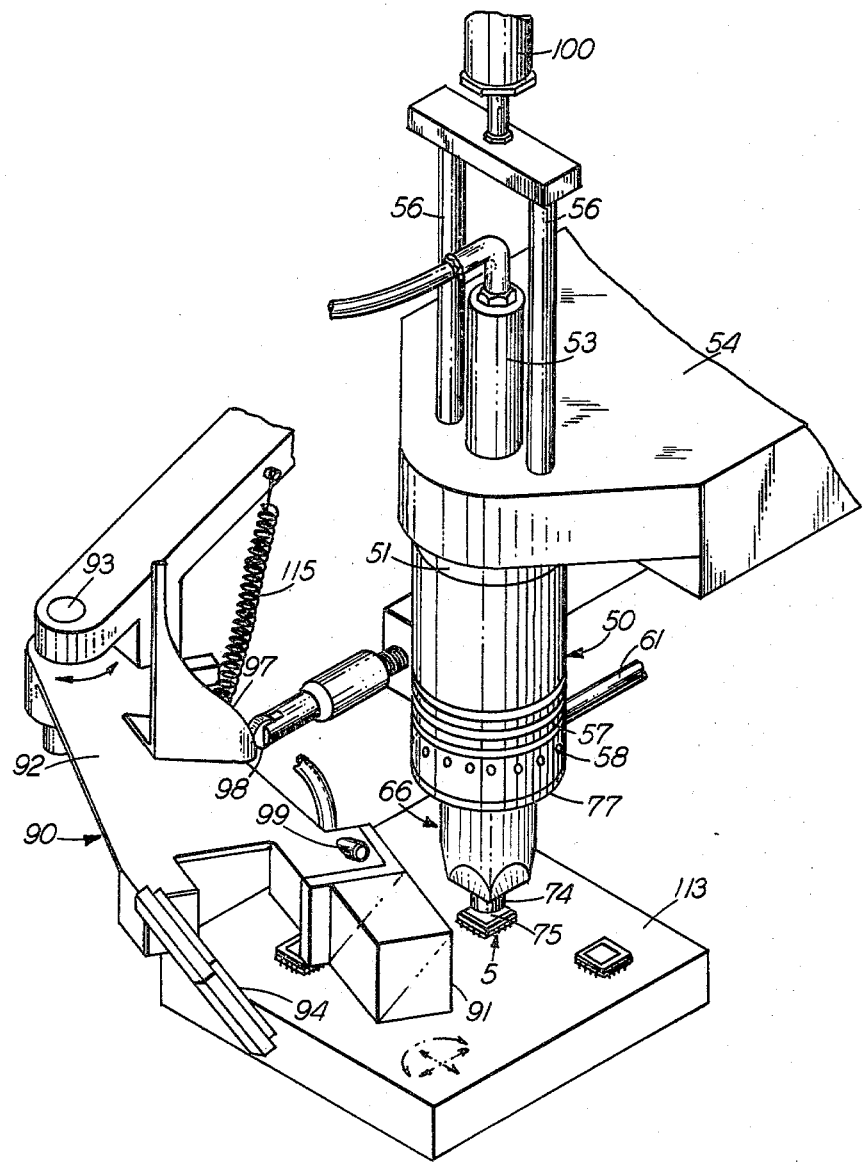

FIGS. 9 and 10 depict exemplary alignment apparatus 90 which is used in conjunction with the instant bonding tool 50. Various types of alignment techniques may be used to align the bonding tool 50 with objects therebelow, one such system is described in U.S. Pat. No. 3,793,710 which is assigned to the instant assignee and is herein incorporated by reference. The apparatus 90 is comprised of a split optics objective, designated generally by the numeral 91, shown mounted on an arm 92 which is pivotally mounted about pin 93 to enable it to swing in (FIG. 9) and out (FIG. 10) of alignment with the vertical axis of the bonding tool 50. A mirror 94 is fixedly mounted to a support arm 96 which, in turn, is also fixedly mounted on the pivotally mounted arm 92. A cam 97 is mounted on the arm 92 and is associated with a cam follower 98. Additionally, an optical fiber bundle 99 is mounted proximate the split optics objective 91 to direct light towards the lower end of the nozzle 66.

In general, the operation of the bonding tool 50 is as follows. The tool 50 in the normal or rest position is as shown in FIGS. 4 and 5 with the flared end fitting 75 extending below the bottom of the nozzle 66. With the flared end fitting 75 extended, the support 54 and the tool 50 are moved downward in unison and the tube end 74a placed in contact with a chip carrier 5. A vacuum is then drawn through the axial channel 73 of the tube 53 and the extension member 74 to hold the chip carrier 5 on the end 74a.

Figure 11:
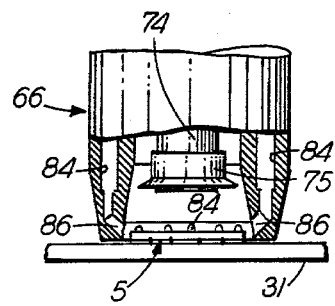
FIG. 11 shows the positioning of the bonding tool nozzle about a chip carrier.
Figure 14:
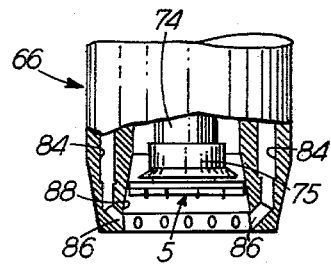
FIG. 14 shows a chip carrier being centered within the bonding apparatus.

To solder a chip carrier 5 to presoldered land areas 34—34 on the metallized substrate 31 the carrier is picked up and the substrate positioned thereunder using the optical alignment technique which will hereinafter be described. Push rods 56—56 are pushed down by a piston 100 to overcome the force of the spring 68 to urge the body portion 51 and nozzle 66 in a downward direction while the rod 53 and the support 54 remain stationary. This positions the carrier 5 within the nozzle 66 with the bottom of the nozzle nearly in contact with the substrate as shown in FIG. 11. The substrate 31 could be contacted, however, contact is normally not made to avoid the possible build up of undesirable flux residues on the nozzle 66. The vacuum may be withdrawn and the end 74a removed from the carrier 5, as shown in FIG. 11 or the end may remain in contact with the chip carrier as hot gas flows down the channels 84—84 and is deflected by the deflector 86 to solder the carrier to the substrate 31.

Figure 12:
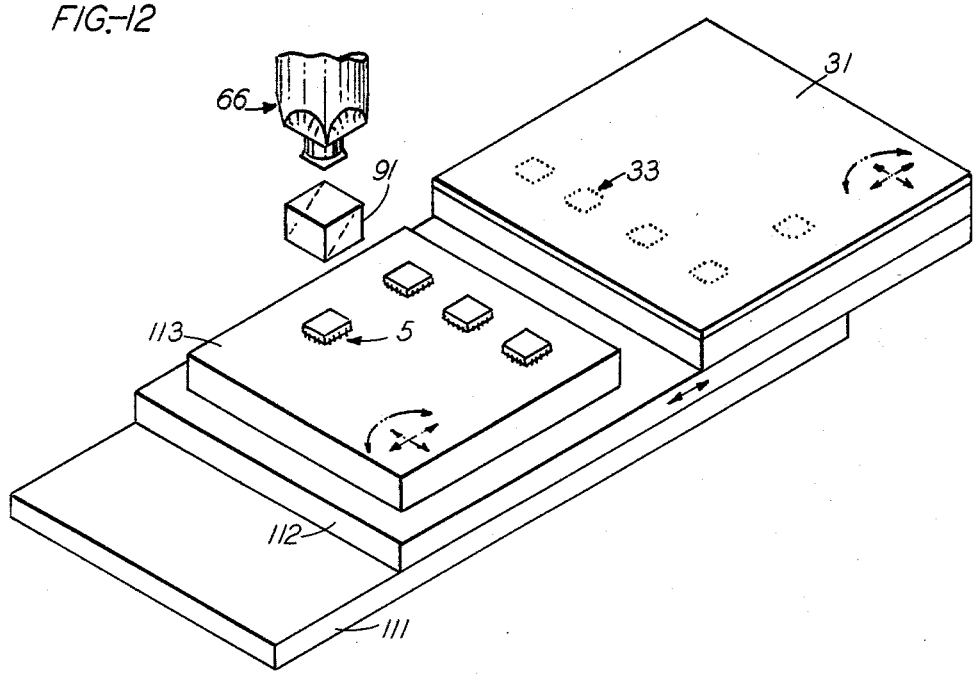
FIG. 12 depicts the alignment of the bonding tool to a chip carrier.

FIGS. 12 to 16 depict exemplary steps of aligning and bonding a chip carrier 5 to a bonding pad array 33 on the PCB substrate 31. FIG. 12 shows a fixed bed 111 which is positioned under the nozzle 66 of the bonding tool 50 only a portion of which is shown for purposes of clarity. A movable table 112 is slideably mounted on the fixed bed 111 as indicated by the double ended arrow. The PCB substrate and a holder 113 are positioned on the movable table 112 and may be held thereon by vacuum, magnetic or other well known means, both may be rotated in their own plane as indicated by the arrows shown. In operation the table 112 is moved to the right and the tube end 74a aligned with a chip carrier 5 using the split optics objective 91.

Figure 13:
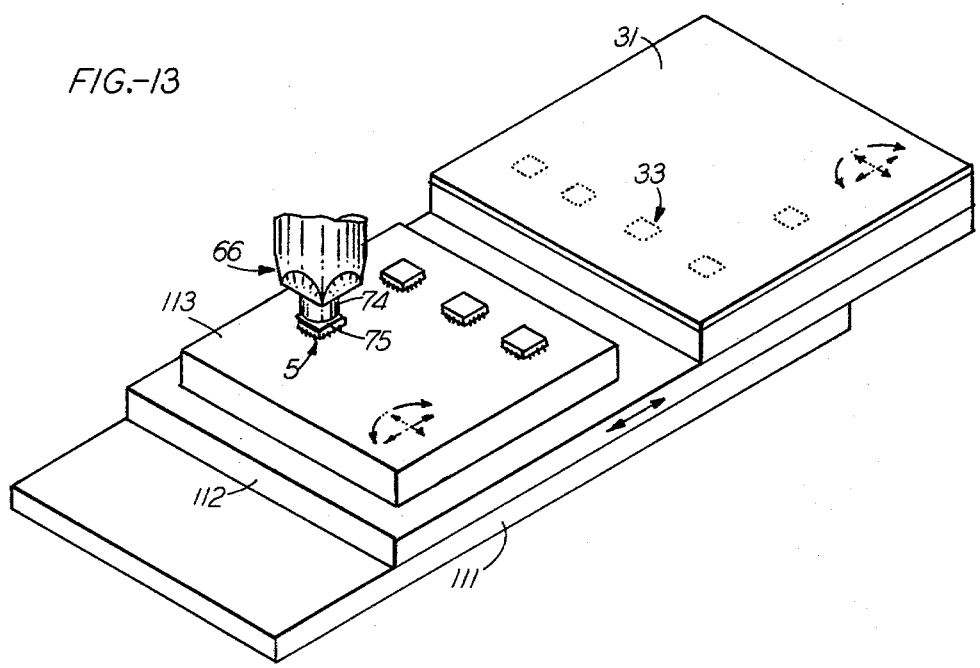
FIG. 13 shows the bonding apparatus picking up a chip carrier.

The alignment of the end 74a of extension member 74 to the carrier 5 can best be seen in FIG. 9. The pivotable arm 92, biased by a spring 115 moves in a counter-clockwise fashion about the pivot point 93 into a position directly below the tool 50. The vertical movement of the bonding tool 50 moves the cam 97 causing the arm 92 and the split optics objective 91 to move towards, or away from the nozzle 66. An operator may then look directly down, into the mirror 94 to view the image in the split optics objective 91. Due to the nature of the split optics objective 91, the operator will see an image of the tube end 74a superimposed on the image of the chip carrier 5. The operator then can move the holder 113 and/or the particular chip carrier 5 until the images are aligned. Once aligned, the bonding tool 50 is moved down, along with the fixedly mounted cam follower 98. The downward movement of the cam follower 98 urges the cam 97 away from the support 54 causing the apparatus 90 to rotate in a clockwise direction about the pivot 93. The clockwise movement of the apparatus 90 moves the split optics objective 91 and light guide 99 out of the path of the downward moving bonding tool 50. The downward movement of the bonding tool 50 is continued so as to bring the end 74a into contact with the chip carrier 5 as shown in FIG. 13. A vacuum is then drawn through the axial channel 73 to hold the device 5 in contact with the end thereof.

The tool 50 is then moved upward and the end 74a with the chip carrier 5 attached thereto is drawn upward into the cavity 81 (see FIG. 14) where the device contacts the flared lower ends 88 to precisely center the device with respect to the axis of the bonding tool 50.

Figure 15:
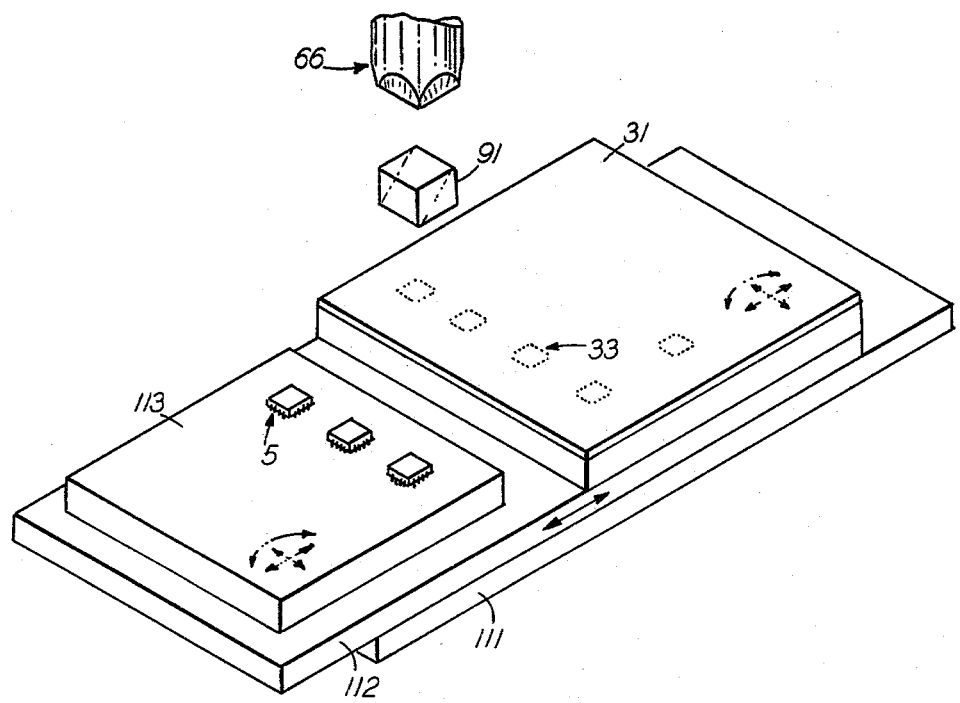
FIG. 15 depicts the alignment of a chip carrier, held by the bonding apparatus, with land areas on a PCB.
Figure 16:
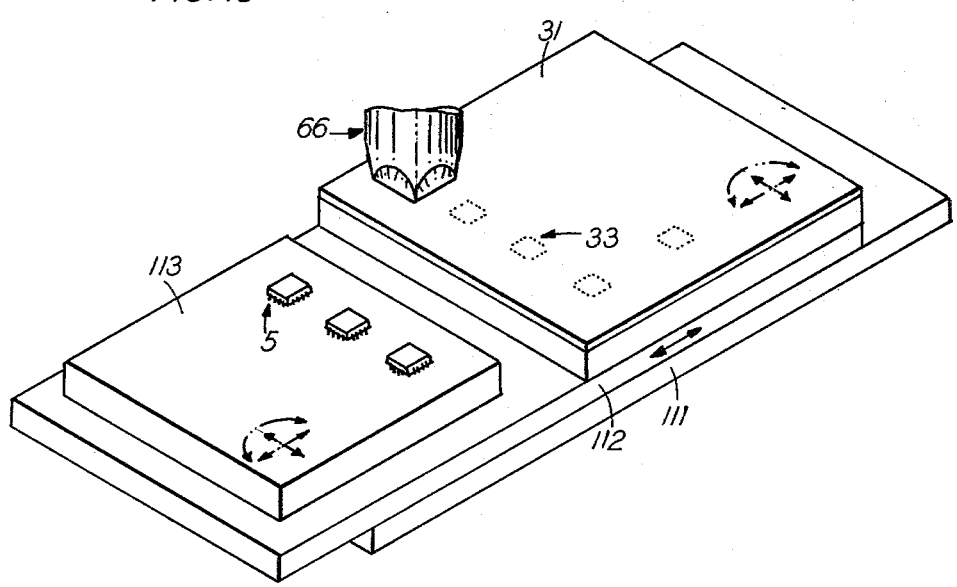
FIG. 16 depicts the bonding to nozzle positioned to reflow solder to bond terminals of the chip carrier to land areas on the PCB.

The pivotable arm 92 is spring biased for rotation in a counter-clockwise direction keeping the cam 97 pressed against the cam follower 98 so as to position the split optics objective 91 under the tool 50 as shown in FIG. 15 as the tool moves upward. The operator slides the table 112 to the left and aligns the chip carrier 5, held by the tool 50, with a bonding pad array 33 by adjusting the position of the PCB substrate 31 until the second ends 21—21 of the leads 14—14 are superimposed on the lands 34—34 as viewed through the split optics objective 91.

The bonding tool 50 is then moved down (see FIG. 10), with the cam follower 98 urging the optical apparatus 90 to rotate out of the way. The nozzle 66 moves into close, spaced relation with PCB substrate 31 and the tube 53 moved down to place the device 5 into contact with the array 33 (see FIGS. 11 and 16). The vacuum is removed from the axial channel 73 of the tube 53 and the chip carrier 5 released. Hot gas (e.g., air, dry nitrogen, or the like) flowing through the line 61, into the annular channel 80 (see FIG. 5) defined by the first and second grooves 76 and 83, respectively, and through channels 84—84 and is redirected horizontally by the deflector 86 onto the presoldered lands 34—34 and second lead ends 21—21 to reflow the solder to form a bond therebetween. It should be noted that the hot gas is redirected by the deflector 86 so as to direct the gas horizontally to provide a lateral flow of the gas across the surface of the lands 34—34, as well as the lead ends 21—21. Additionally, each hot gas channel 84 is associated with a single lead end 21.

The gas, after heating the bond site, moves into the central cavity 81 and passes through the exit ports 58—58. Additionally, some of the gas will pass between the bottom of the nozzle 66 and the substrate 31. Once the chip carrier 5 has been bonded to an array 33, the tool 50 is moved upward and the foregoing steps repeated until the required number of devices 55 have been bonded to the PCB substrate 31.

In an alternate embodiment referred to in relation to FIG. 7, slots 89—89, rather than channels 84—84, may be formed in the nozzle 66 to direct the hot gas at all the leads 14—14 on one side of the chip carrier 5.

It should be clear to one skilled in the art that the instant tool 50 may also be used to remove a bonded device 5 from a PCB substrate 31 by (1) aligning the tool 50 with the device 5 to be removed, (2) positioning the tool near, or in contact with the substrate with the nozzle 66 about the device, (3) moving the end 74a of the extension member 74 tube 53 into contact with the device and drawing a vacuum through the axial channel 73, (4) directing the hot gas onto the ends 21—21 of the leads 14—14 via the channels 84 and the deflectors 86, and (5) upon reflow of the solder bond the tool, with the chip carrier 5 attached to the end 74a is moved upward to remove the device from the PCB substrate.

It should also be clear to one skilled in the art that tools 50 having multiple nozzles 66 which can simultaneously bond and/or remove a plurality of devices 5—5 can be readily fabricated using the instant inventive concepts. Additionally, various other modifications may be made to the instant exemplary embodiments without departing from the spirit and scope of the invention.

What is claimed is:

1. A method of bonding an article to a metallized substrate, at least one of which has a predeposited reflowable bonding material thereon, the method comprising the steps of:

positioning the article on the metallized surface of the substrate;

directing at least one stream of hot gas towards the substrate;

redirecting the gas stream laterally, substantially parallel to the surface of the substrate, towards the article to reflow the material; and resolidifying the material to form a bond between the article and the metallized surface of the substrate.

2. A method of bonding an article to lands on a metallized substrate, at least one of which has a predeposited reflowable bonding material thereon, the method comprising the steps of:
positioning a nozzle, having a recess in a first end thereof to accommodate the article therein, about the article;
directing a hot gas through channels within the walls of the nozzle toward the first end thereof;
deflecting the hot gas, in a direction substantially parallel to the surface of the substrate towards the article and land areas, to reflow the material; and
resolidifying the material to form a bond between the article and the substrate.

3. A method of removing an article bonded to a metallized substrate with a reflowable bonding material, the method comprising the steps of:
directing at least one stream of hot gas towards the substrate;
deflecting the hot gas stream in a direction substantially parallel to the surface of the substrate, towards the bonding material; and
removing the article from the metallized substrate as the material reflows.

4. The method as set forth in claims 1, 2 or 3, wherein:
the bonding material is solder and the article is a chip carrier.

5. A method for simultaneously soldering-desoldering terminals on a multisided article having a plurality of terminals on each side, which mate with a like plurality of land areas on the surface of a metallized substrate, the method comprising the step of:
simultaneously laterally directing individual streams of hot gas substantially parallel to the surface of the substrate at each mating land area and terminal to reflow solder thereon to solder-desolder the terminals and land areas.

6. An apparatus for bonding an article to a metallized substrate, at least one of which has a predeposited reflowable bonding material thereon, the apparatus comprising:
a housing having a hollow central portion to receive the article at the first end thereof with a plurality of longitudinally extending channels within the wall of said housing; and
deflecting means located at the first end of the housing at the terminals of the channels to deflect hot gas, passing through the channels, laterally, substantially parallel to the surface of the substrate, towards the article to reflow the bonding material to bond the article to the substrate.

7. An apparatus for soldering-desoldering an article to a metallized substrate, the apparatus comprising:
a housing having a recess in a first end thereof with a plurality of longitudinally extending channels within the wall of said housing;
the longitudinal extending channels terminate at an angled deflector positioned proximate said recess; and
means for directing hot gas through the channels, toward the deflector which deflects the gas laterally substantially parallel to the surface of the substrate, towards the article to solder-desolder the article.

8. The apparatus as set forth in claims 6 or 7 wherein:
a vacuum pickup apparatus is mounted for axial movement within the hollow central portion of the housing.

9. The apparatus as set forth in claim 6 wherein:
the wall defining the hollow central portion has an outward taper which centers the article within the housing when the article is positioned therein.

* * * * *